(12) United States Patent
Tabatabai et al.

(10) Patent No.: US 10,020,792 B2
(45) Date of Patent: Jul. 10, 2018

(54) PHASE SHIFTER

(71) Applicant: Google Inc., Mountain View, CA (US)

(72) Inventors: Farbod Tabatabai, Sausalito, CA (US); Kirk Garrett Laursen, Palo Alto, CA (US); Dedi David Haziza, Sunnyvale, CA (US)

(73) Assignee: Google LLC, Mountain View, CA (US)

( * ) Notice: Subject to any disclaimer, the term of this patent is extended or adjusted under 35 U.S.C. 154(b) by 344 days.

(21) Appl. No.: 14/863,746

(22) Filed: Sep. 24, 2015

(65) Prior Publication Data

US 2017/0093363 A1 Mar. 30, 2017

(51) Int. Cl.
| | |
|---|---|
| *H03H 7/20* | (2006.01) |
| *H01Q 3/26* | (2006.01) |
| *H01P 5/18* | (2006.01) |
| *H01P 1/18* | (2006.01) |
| *H01Q 1/50* | (2006.01) |
| *H01P 9/04* | (2006.01) |

(52) U.S. Cl.
CPC ............ *H03H 7/20* (2013.01); *H01P 1/184* (2013.01); *H01P 5/187* (2013.01); *H01P 9/04* (2013.01); *H01Q 1/50* (2013.01); *H01Q 3/2694* (2013.01)

(58) Field of Classification Search
CPC ........ H01Q 3/2694; H01Q 3/38; H01P 1/184; H01P 5/186–5/187; H03H 7/20–7/21
See application file for complete search history.

(56) References Cited

U.S. PATENT DOCUMENTS

| | | | |
|---|---|---|---|
| 4,603,310 | A | 7/1986 | Yarman |
| 4,604,593 | A | 8/1986 | Yarman |
| 4,614,921 | A | 9/1986 | Yarman |
| 4,630,010 | A | 12/1986 | Yarman |

(Continued)

FOREIGN PATENT DOCUMENTS

| | | |
|---|---|---|
| EP | 0621652 A1 | 10/1994 |
| EP | 0645885 A1 | 3/1995 |

(Continued)

OTHER PUBLICATIONS

S. Nam, C. F. Oztek-Yerli and I. D. Robertson, "Monolithic amplitude and phase control circuits for 17/18 GHz indoor radio applications," IEE Colloquium on Advanced Signal Processing for Microwave Applications (Digest No. 1996/226), London, 1996, pp. 5/1-5/6.*

(Continued)

*Primary Examiner* — Jessica Han
*Assistant Examiner* — Amal Patel
(74) *Attorney, Agent, or Firm* — Honigman Miller Schwartz and Cohn LLP

(57) ABSTRACT

An interdigital capacitor low loss and high resolution phase shifter is disclosed. The phase shifter includes an input port, a first electrode connected to the input port, an output port and a second electrode connected to the output port and arranged substantially parallel to the first electrode. The phase shifter also includes a substrate disposed between the first electrode and the second electrode, a first variable capacitor disposed on the first electrode and a second variable capacitor disposed on the second electrode. Adjustment of one or more of the variable capacitors causes a phase shift between the input port and the output port.

22 Claims, 9 Drawing Sheets

(56) References Cited

U.S. PATENT DOCUMENTS

| | | | |
|---|---|---|---|
| 6,029,075 A | 2/2000 | Das | |
| 7,049,907 B2* | 5/2006 | Gurvich | H03F 1/3229 333/139 |
| 7,154,440 B2 | 12/2006 | Toncich et al. | |
| 8,249,528 B2* | 8/2012 | Harel | H04B 7/022 455/101 |
| 8,880,006 B2 | 11/2014 | Caron | |
| 2004/0239446 A1 | 12/2004 | Gurvich et al. | |
| 2009/0320591 A1 | 12/2009 | Johnson | |
| 2014/0315500 A1 | 10/2014 | Ding et al. | |

FOREIGN PATENT DOCUMENTS

| | | |
|---|---|---|
| JP | 57157602 | 9/1982 |
| JP | H1131902 A | 2/1999 |
| JP | 2001203502 A | 7/2001 |
| JP | 2009231904 A | 10/2009 |
| JP | 5206703 A | 6/2013 |

OTHER PUBLICATIONS

Taiwanese Office Action for the related TW Application No. 105121623 dated Feb. 3, 2017 with English translations thereof.
Nam S et al: "Monolithic amplitude and phase control circuits for 17/18 GHz indoor radio applications", Nov. 29, 1996 pate 5/1-5/6.
International Search Report and Written Opinion for Application No. PCT/US2016/038049 dated Oct. 12, 2016.

* cited by examiner

PHASE SHIFTER

TECHNICAL FIELD

This disclosure relates to phase shifters.

BACKGROUND

In general, a phase shifter point changes the phase of the output signal in relation to the input shifter. Phase shifts have numerous uses including, but not limited to, phase discriminators, beam forming networks, power dividers, linearization of power amplifiers, phased array antennas, and electronically steered antennas. As one example application, phased array antennas combine multiple individual transmit/receive (T/R) modules and antennas to create a larger effective aperture. The electronically controlled phase and gain relationship between the individual T/R modules controls the radiation pattern and therefore directivity of the synthesized aperture. The phase is controlled by a phase shifter. This control over the radiation pattern can be used for beam steering in air and space-borne communication systems, for target acquisition and tracking, or for the synthesis of deep nulls for clutter suppression in radar systems.

SUMMARY

One aspect of the disclosure provides an interdigital capacitor low loss and high resolution phase shifter. The phase shifter includes an input port, a first electrode connected to the input port, an output port and a second electrode connected to the output port and arranged substantially parallel to the first electrode. The phase shifter also includes a substrate disposed between the first electrode and the second electrode, a first variable capacitor disposed on the first electrode, and a second variable capacitor disposed on the second electrode. Adjustment of one or more of the variable capacitors causes a phase shift between the input port and the output port.

Implementations of the disclosure may include one or more of the following optional features. In some implementations, the phase shifter includes a first inductor disposed on the first electrode in parallel with the first variable capacitor and a second inductor disposed on the second electrode in parallel with the second variable capacitor. Each variable capacitor may be shunt with the corresponding inductor on the respective electrode. At least one variable capacitor may be a digitally adjustable variable capacitor. Each variable capacitor may be independently adjustable in response to a change in a signal entering the input port.

The phase shifter may include a third electrode connected to the first electrode and arranged substantially parallel to the first electrode and the second electrode, and a fourth electrode connected to the second electrode and arranged substantially parallel to the first electrode, the second electrode, and the third electrode. The phase shifter may further include a third variable capacitor disposed on the third electrode and a fourth variable capacitor disposed on the fourth electrode. The phase shifter may also include a third inductor disposed on the third electrode in parallel with the third variable capacitor and a fourth inductor disposed on the fourth electrode in parallel with the fourth variable capacitor, wherein each variable capacitor is shunt with the corresponding inductor on the respective electrode.

Another aspect of the disclosure provides a system for operating an interdigital capacitor low loss and high resolution phase shifter. The system includes an antenna configured to emit a signal and a phase shifter connected to the antenna. The phase shifter includes an input port configured to receive the signal, a first electrode connected to the input port, an output port in communication with the antenna, and a second electrode connected to the output port and arranged substantially parallel to the first electrode. The phase shifter further includes a substrate disposed between the first electrode and the second electrode, a first variable capacitor disposed on the first electrode, and a second variable capacitor disposed on the second electrode, where adjustment of one or more of the variable capacitors causes a phase shift between the input port and the output port.

This aspect may include one or more of the following optional features. The system may include a transceiver connected to the antenna and configured to transmit or receive the signal, wherein the transceiver includes the phase shifter. The phase shifter may further include a first inductor disposed on the first electrode in parallel with the first variable capacitor and a second inductor disposed on the second electrode in parallel with the second variable capacitor. Each variable capacitor may be shunt with the corresponding inductor on the respective electrode. At least one variable capacitor may be a digitally adjustable variable capacitor. Each variable capacitor may be independently adjustable in response to a change in the signal entering the input port.

In some examples, the phase shifter includes a third electrode connected to the first electrode and arranged substantially parallel to the first electrode and the second electrode, a fourth electrode connected to the second electrode and arranged substantially parallel to the first electrode, the second electrode, and the third electrode. The phase shifter may also include a third variable capacitor disposed on the third electrode and a fourth variable capacitor disposed on the fourth electrode. The phase shifter may also include a third inductor disposed on the third electrode in parallel with the third variable capacitor and a fourth inductor disposed on the fourth electrode in parallel with the fourth variable capacitor, wherein each variable capacitor is shunt with the corresponding inductor on the respective electrode. In some examples, the adjustment of one or more of the variable capacitors causes the phase shift to be approximately between zero and 360 degrees between the input port and the output port.

Yet another aspect of the disclosure provides a method for operating an interdigital capacitor low loss and high resolution phase shifter. The method includes receiving a signal having a first phase at a phase shifter. The phase shifter includes an input port configured to receive the signal, a first electrode connected to the input port, an output port, and a second electrode connected to the output port and arranged substantially parallel to the first electrode. The phase shifter further includes a substrate disposed between the first electrode and the second electrode, a first variable capacitor disposed on the first electrode, and a second variable capacitor disposed on the second electrode, where adjustment of one or more of the variable capacitors causes a phase shift between the input port and the output port. The method further includes adjusting at least one of the variable capacitors and outputting the signal at the output port of the phase shifter, the outputted signal having a second phase.

In some examples, the phase shifter further includes a first inductor disposed on the first electrode in parallel with the first variable capacitor, and a second inductor disposed on the second electrode in parallel with the second variable capacitor. Each variable capacitor may be shunt with the corresponding inductor on the respective electrode. At least one variable capacitor may be a digitally adjustable variable capacitor. The method may include independently adjusting the variable capacitors.

The phase shifter may further include a third electrode connected to the first electrode and arranged substantially parallel to the first electrode and the second electrode, a fourth electrode connected to the second electrode and arranged substantially parallel to the first electrode, the second electrode, and the third electrode, a third variable capacitor disposed on the third electrode, and a fourth variable capacitor disposed on the fourth electrode. The phase shifter may further include a third inductor disposed on the third electrode in parallel with the third variable capacitor, and a fourth inductor disposed on the fourth electrode in parallel with the fourth variable capacitor, wherein each variable capacitor is shunt with the corresponding inductor on the respective electrode. The method may further include outputting the signal from the output port of the phase shifter to an antenna.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

In many applications, various signals require the adjustment of the phase of a signal or wave. For example, in radio transmission systems, an array of antennas can be used to increase the ability to communicate at greater range and/or increase antenna gain in a direction over individual elements. In a phased array antenna, the phase of individual elements may be adjusted to shape the area of coverage, resulting in longer transmissions or steering the transmission direction without physically moving the array. The shape of the coverage may be adjusted by the alteration of individual elements transmission phase and gain in the array. This application describes a phase shifter.

Figure 1A:
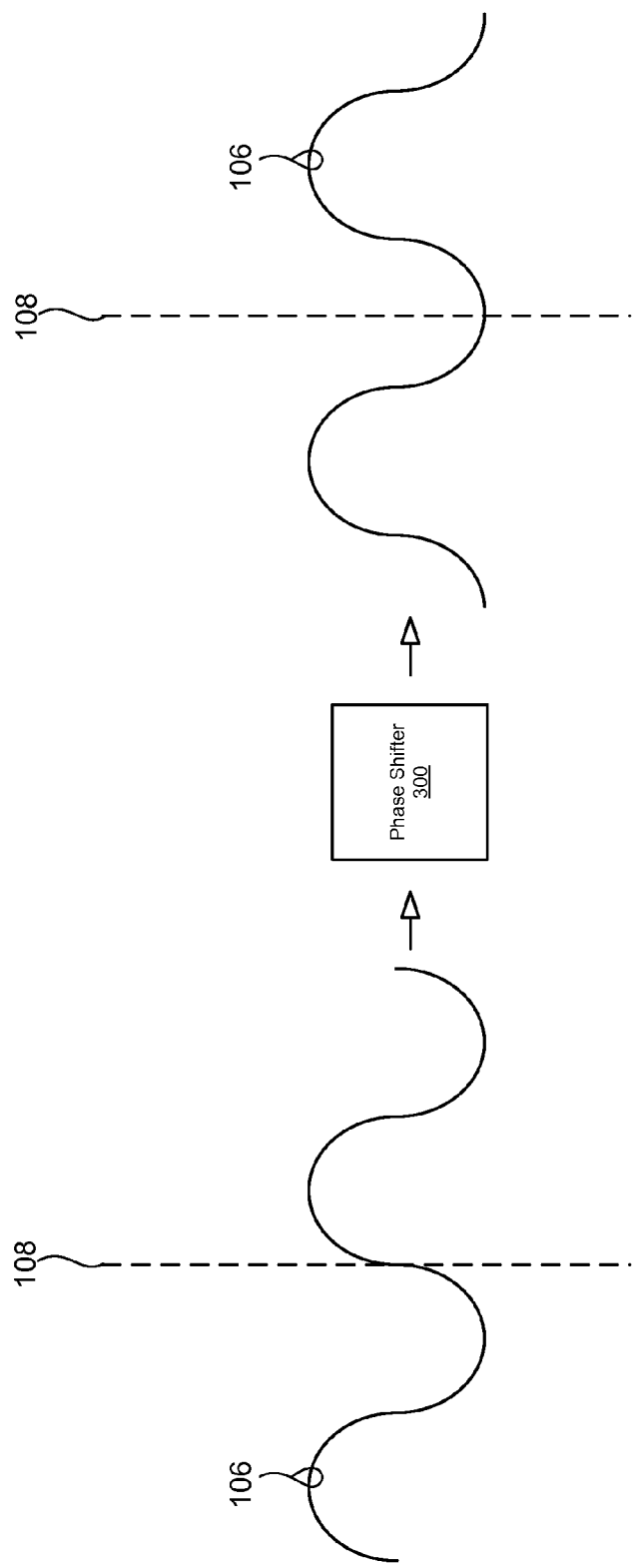
FIG. 1A provides a schematic view of an example signal being phase shifted by a phase shifter.

FIG. 1A provides a schematic view of an example signal 106 being phase shifted by a phase shifter 300. A signal 106 with a phase 124 enters a phase shifter 300. The phase 124 of the signal 106 is measured by reference to a reference line 108. The phase of cyclical signal 106 is how much of the signal 106 has passed a given reference before repeating. The phase shifter 300 shifts the amount of the signal 106 that has passed the reference line 108. In this example, the phase shifter 300 has shifted the signal 106 phase 124, 45 degrees.

Figure 1B:
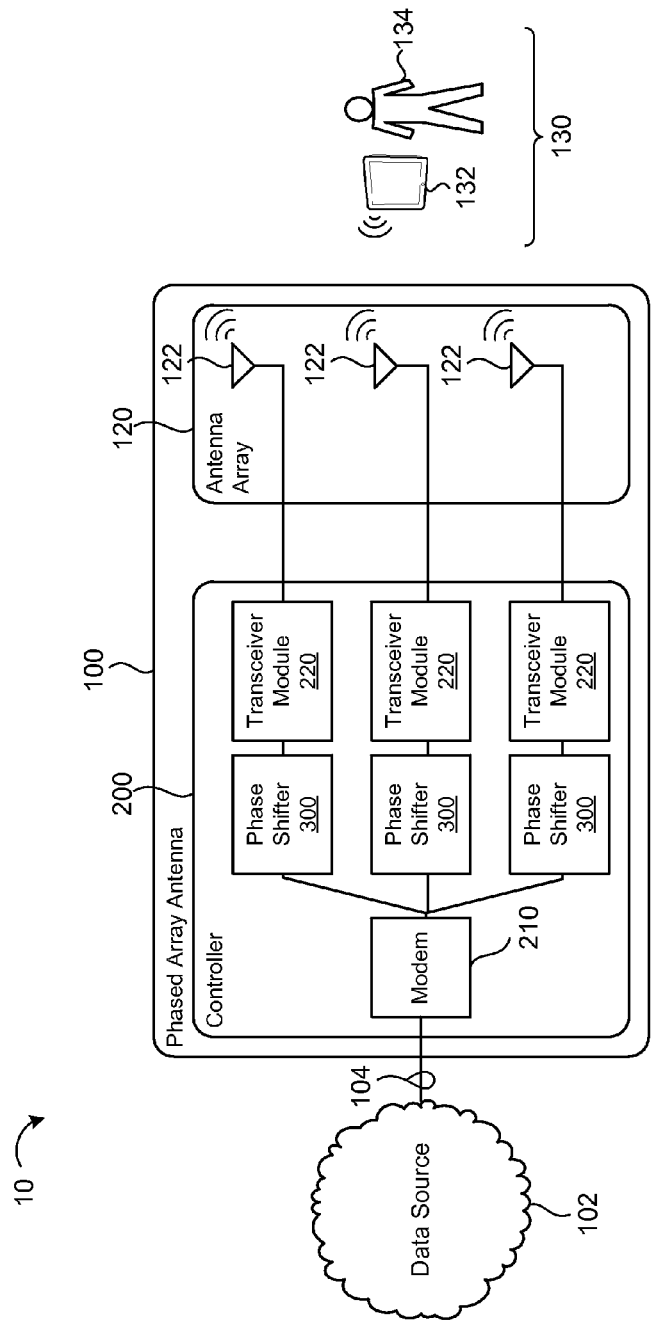
FIG. 1B provides a schematic view of an example phased array antenna system including a phase shifter.

FIG. 1B provides a schematic view of an example phased array antenna system 10 including a phase shifter 300. The phased array antenna system 10 includes a phased array antenna 100 in communication with a data source 102 and a remote system 130. In the example shown, the phased array antenna 100 includes a controller 200 in communication with an antenna array 120 composed of a plurality of antennas 122. The controller 200 includes a modem 210 in communication with a plurality of phased shifters 300. The phase shifters 300 are in communication with a plurality of transceiver modules 220. The modem 210 receives data 104 from the data source 102 and converts the data 104 into a form suitable to be transmitted to the antenna array 120. For example, the modem 210 converts the data 104 to a signal 106 for transmission or receipt by the transceiver module 220 via electromagnetic energy or radio signals. The phase shifters 300 adjust the signal 106 to steer or focused the electromagnetic energy emitted by the antenna array 120. The antenna array 120 may transmit the electromagnetic energy over the air for receipt by the remote systems 130. The remote systems 130 may include a transceiver device 132 associated with a user 134. The phased array antenna system 10 can also operate in the reverse order, with the remote system 130 transmitting electromagnetic energy to the antenna array 120, which the controller 200 converts to data 104. In some implementations, the phase shifter 300 and modem 210 are located separately from the controller 200 or in a second controller 200.

Figure 1C:
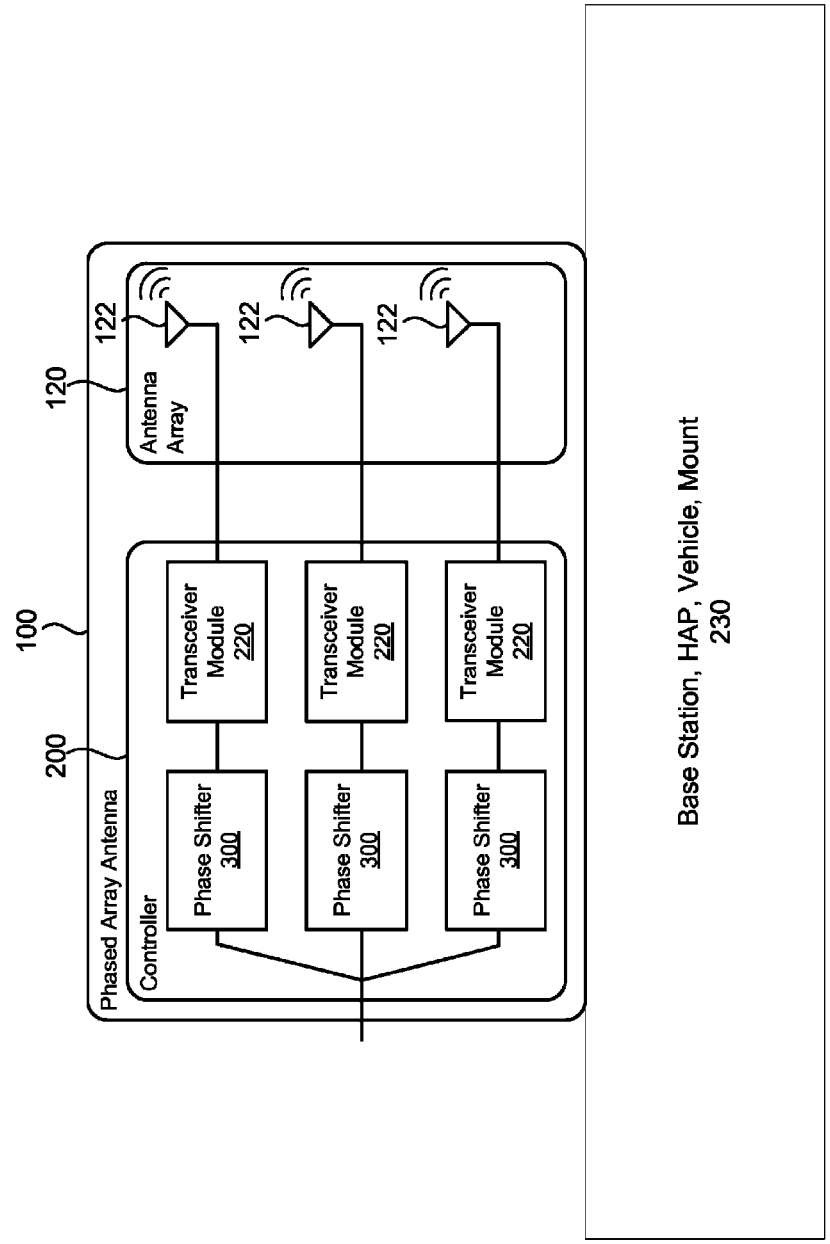
FIG. 1C provides a schematic view of an example phased array antenna system with a phase shifter mounted on a base station, high altitude platform (HAP), vehicle or mount.

FIG. 1C provides a schematic view of an example phased array antenna system 10 with a phase shifter 300 mounted on a base station, HAP, vehicle or mount 230. In some examples, the HAP 230 is an unmanned aerial system (UAS). The two terms are used interchangeably throughout this application. In the example shown, the HAP 230 includes a body that supports a phased array antenna system 10, which can communicate with a remote system 130, or other HAPs 230 through a communication (e.g., radio signals or electromagnetic energy). The HAP 230 may communicate various data and information to the remote system 130 such as, but not limited to, airspeed, heading, attitude position, temperature, GPS (global positioning system) coordinates, wind conditions, flight plan information, fuel quantity, battery quantity, data received from other sources, data received from other antennas, sensor data, etc. The remote system 130 may communicate to the HAP 230 various data and information, such as, but not limited to, flight directions, flight condition warnings, control inputs, requests for information, requests for sensor data, data to be retransmitted via other antennas or systems, etc. The HAP 230 may be various implementations of flying craft including a combination of the following such as, but not limited to an airplane, airship, helicopter, gyrocopter, blimp, multicopter, glider, balloon, fixed wing, rotary wing, rotor aircraft, lifting body, heavier than air craft, lighter than air craft, etc. The phased array antenna system 10 maybe mounted on other objects as well for communication purposes. The other objects include, but are not limited to, an aerial platform (e.g., drone), a terrestrial platform (e.g., car, truck, train, etc.), or an aquatic platform (e.g., boat).

One of the challenges associated with establishing a communication system between a HAP 230 and remote system is the movement of the HAP 230. One solution to this problem is the use of an omnidirectional antenna system on the HAP 230 and remote system. This presents disadvantages as an omnidirectional antenna has a lower gain and therefore range in exchange for its ability to receive from all directions. A directional antenna may be used to improve the gain and range of the system, but this presents its own challenges as depending on how directional the antenna is, the craft may move out of the antennas transmission or reception area. When using a directional antenna, a system needs to move both of the antennas (i.e., the HAP antenna and the remote system antenna) to keep the antennas aligned between the aircraft and the ground. This becomes more challenging with greater directionality of the antenna. Additionally, various conditions may cause the HAP 230 to unintentionally move location, such as, but not limited to, wind, thermals, other craft, turbulence, etc., making the system moving the antenna forced to rapidly correct if continuous communication is required. A highly directional antenna may create a narrow cone transmission shape requiring the antenna to be moved on two axes to maintain alignment. A phased antenna array 10 with a fast response phase shifter 300 can be rapidly steered while still providing good directional antenna strength.

Figure 2A:
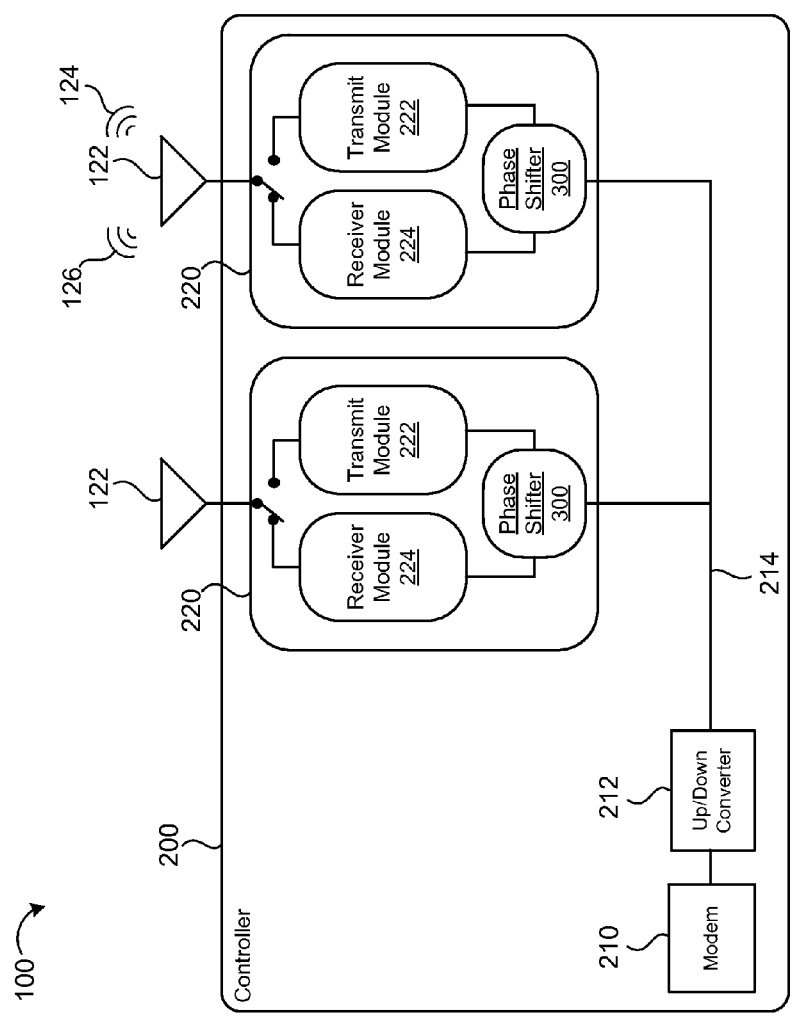
FIG. 2A provides a schematic view of an example phased array antenna including a controller, which includes a modem to receive data and a phase shifter.

FIG. 2A provides a schematic view of an example phased array antenna 100 including a controller 200, which includes a modem 210 to receive data 104 and a phase shifter 300. The modem 210 transfers the data 104 an up down converter 212. The up down converter 212 converts the signal 106 from a data based form into a digitized real signal centered at an intermediate frequency to a baseband complex signal centered at zero frequency or the reverse. Upon this conversion, the up down converter 212 sends the signal 106 via a corporate feed 214 to at least one or more transceivers modules 220, which send or receive the signal 106 via the corresponding antenna 122. The phased array antenna 100 includes the combination of the plurality of the antenna 122 and the transceiver modules 220. Contained within the transceiver module 220 is a transmit module 222 and receiver module 224, which can be connected to the antenna 122 depending on if the transceiver is required to transmit or receive. Connected to both the transmit module 220 and receiver module 224 is the phase shifter 300. The phase shifter 300 is independently controllable and allows the shape and direction of the electromagnetic energy emitted by the antenna 122 to be adjusted. The antenna 122 transmits electromagnetic energy with a phase 124 and a gain 126. The gain 126 is representative of the power or peak height of the electromagnetic wave. The phase 124 is representative of the fraction of the electromagnetic signal wave in relation to an arbitrary origin point.

Figure 2B:
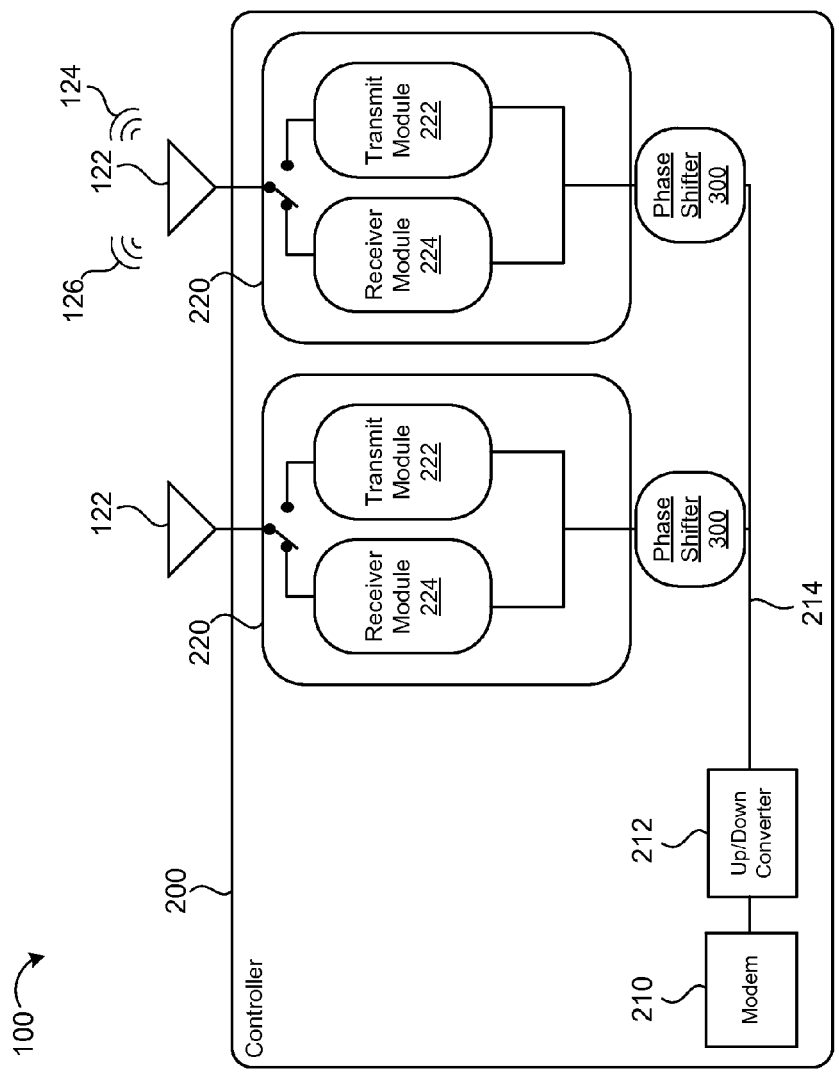
FIG. 2B provides a schematic view of an example phased array antenna where the phase shifter is located outside the transceiver.

FIG. 2B provides a schematic view of an example phased array antenna 100 where the phase shifter 300 is located outside the transceiver 220. In some examples, the phase shifter 300 is connected to each respective transceiver 220 and receives a signal 106 from the corporal feed 214. The phase shifter 300 delivers the phase shifted signal 106 to the transceiver 220 for transmission to the antenna 122. In the reverse, the antenna 122 receives a signal 106, and sends the signal 106 to the transceiver 220. The transceiver 220 sends the signal 106 to the phase shifter 300 for phase shifting. The phase shifter sends the signal 106 to the corporal feed 214.

Figure 3A:
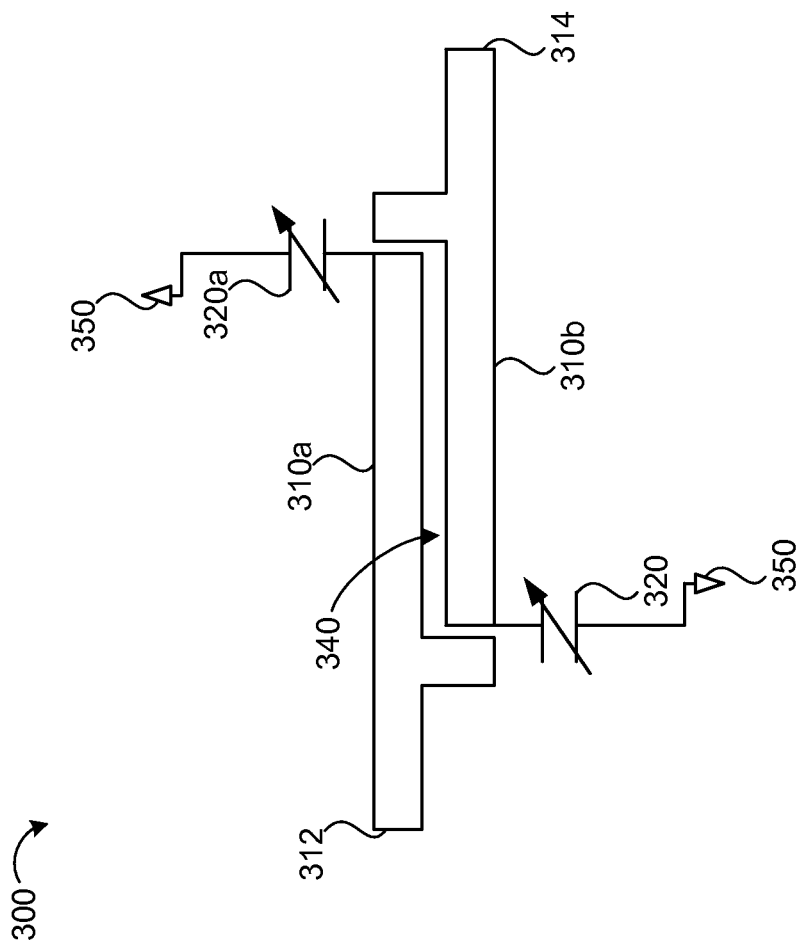
FIG. 3A provides a schematic view of an example phase shifter.

FIG. 3A provides a schematic view of an example phase shifter 300. The phase shifter 300 contains two or more electrodes 310. Connected to the first electrode 310a is an input port 312. The input port 312 allows a signal 106 or electromagnetic wave to enter the first electrode 310a. The signal 106 or electromagnetic wave builds up a charge on the first electrode 310a and passes over a substrate 340 to a second electrode 310b. The charge on the second electrode 310b exits the phase shifter 300 at the output port 314. As the charge difference increases the total stored energy on the electrodes 310 increases. The first electrode 310a is arranged substantially parallel to the second electrode 310b. In some examples, the electrodes 310 are arranged at slight incidences to each other to allow for a different total capacitance and response. Connected to each electrode 310 is a variable capacitor 320. The variable capacitor 320 may be a digital variable capacitor 320 allowing the phase 124 of the signal 106 to be shifted by a digital controller of some form. In some examples, the variable capacitor 320 is connected to ground 350, or is a shunt variable capacitor 320. The combination of two electrodes 310 and substrate 340 separating the electrodes 310 may be referred to as an interdigital capacitor. The electrodes 310 may be comprised of a variety of materials such that they are conductive to the signal 106 or electromagnetic wave being sent through the electrode 310. The substrate 340 may be comprised of a variety of dielectric or non-conductive materials, including but not limited to air, fiberglass, PC board materials, liquids, etc.

As a signal 106 or electromagnetic wave enters the input port 312, a charge builds up on the first electrode 310a in relation to the voltage of the signal 106 or electromagnetic wave. As the charge builds there, a responsive charge builds on the second electrode 310b. Depending on the total capacitance of the phase shifter 300 including the first variable capacitor 320a, second variable capacitor 320b, and capacitance of the interdigital capacitor, the response time of the system changes. This change in response time results in a change of phase 124 between the signal 106 present at the input port and the signal 106 present at the output port. Explained another way, as the total capacitance increases the time between the charge required on the first electrode 310a to transfer the charge to the second electrode 310b, the changes resulting in a phase shift. Adjustment of the variable capacitors 320 allows adjustment of the phase 124 of the signal 106 presented to the phase shifter 300. This phase shifter 300 allows for a very low insertion loss.

Figure 3B:
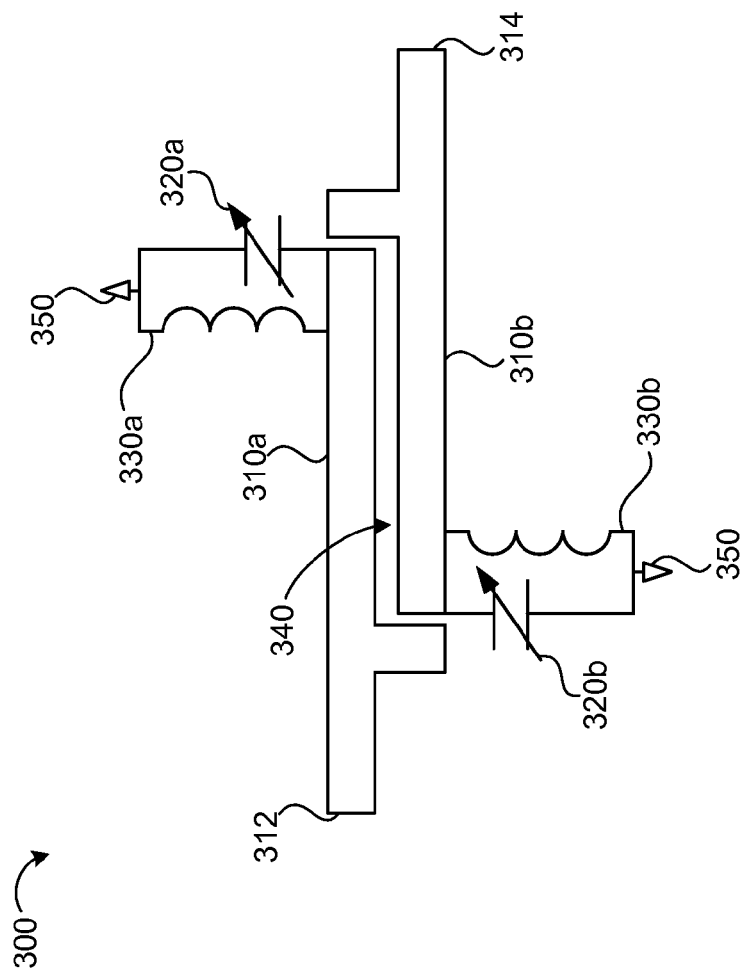
FIG. 3B provides a schematic view of an example phase shifter with a variable capacitor and an inductor.

FIG. 3B provides a schematic view of an example phase shifter 300 with a variable capacitor 320 and an inductor 330. In some examples, it is advantageous to connect both an inductor 330 and a variable capacitor 320 to each electrode 310. The inductor 330 and variable capacitor 320 may be connected in parallel and to ground 350. The combination of the inductor 330 and variable capacitor 320 increase the dynamic range and allow for a full 360 degree shift of the phase 124 of the signal 106. In some examples, the combination of the inductor 330 and variable capacitor 320 allow the dynamic range to be increased without increasing the total capacity reducing total insertion losses. The inductor 330 and variable capacitor 320 may form an LC circuit allowing the phase shifter 300 to operate at a given frequency or to phase shift part of a more complex signal 106. In some examples, the inductor 330 and variable capacitor 320 may form a tuned LC circuit resonate at a particular frequency band allowing the phase shifter 300 a greater dynamic range and with a lower total capacitance. In some examples, the inductor 330 and variable capacitor 320 LC circuit act as a filter to limit loss in the phase shifter 300.

The inductor 330 and variable capacitor 320 may be shunt inductors 330 and variable capacitors 320.

Figure 3C:
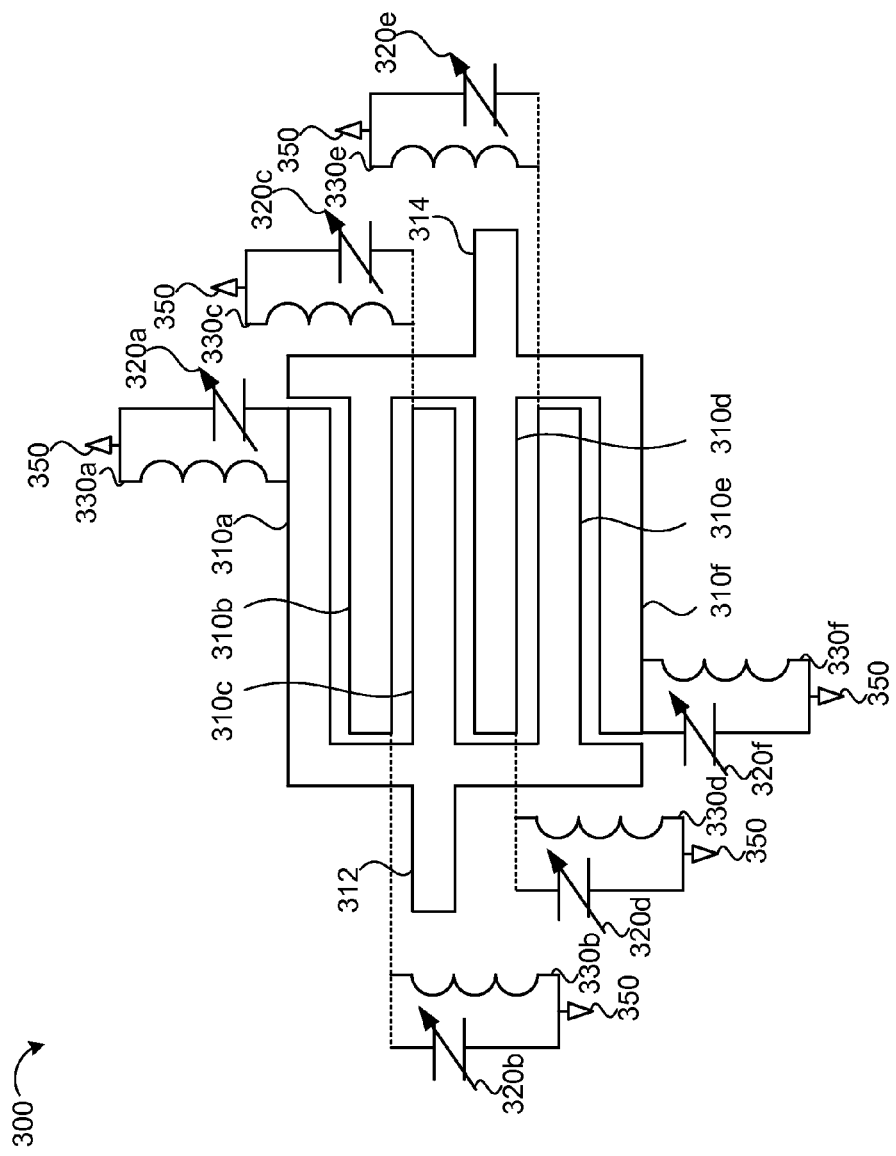
FIG. 3C provides a schematic view of an example phase shifter with multiple electrodes, variable capacitors and inductors.

FIG. 3C provides a schematic view of an example phase shifter 300 with multiple electrodes 310, variable capacitors 320 and inductors 330. The greater the capacitance of the individual variable capacitors 320, the lower the resolution of the shift in the phase 124. In order to increase the resolution of the phase 124 shift provided by the phase shifter 300, multiple electrodes 310 may be added with each electrode 310, 310a . . . f having its own respective variable capacitor 320 and inductor 330. The plurality of variable capacitors 320 allows each individual variable capacitor 320 to remain small, providing good resolution while still allowing sufficient total capacitance to provide 360 degrees of phase 124 shift. A first electrode 310a, third electrode 310c and fifth electrode 310e are connected to the input port 312. A second electrode 310b, fourth electrode 310d, and sixth electrode 310f are connected to the output port 314. Separating the first electrode 310a, third electrode 310c and fifth electrode 310e from the second electrode 310b, fourth electrode 310d, and sixth electrode 310f is a substrate. This allows the combination of the first electrode 310a, third electrode 310c and fifth electrode 310e and the second electrode 310b, fourth electrode 310d, and sixth electrode 310f to act as a single interdigital capacitor. The first electrode 310a is connected to a first variable capacitor 320a and a first inductor 330a. The first variable capacitor 320a and the first inductor 330a may be connected in parallel to ground 350. The second electrode 310b is connected to a second variable capacitor 320b and a second inductor 330b. The second variable capacitor 320b and the second inductor 330b may be connected in parallel to ground 350. The third electrode 310c is connected to a third variable capacitor 320c and a third inductor 330c. The third variable capacitor 320c and the third inductor 330c may be connected in parallel to ground 350. The fourth electrode 310d is connected to a fourth variable capacitor 320d and a fourth inductor 330d. The fourth variable capacitor 320d and the fourth inductor 330d may be connected in parallel to ground 350. The fifth electrode 310e is connected to a fifth variable capacitor 320e and a fifth inductor 330e. The fifth variable capacitor 320e and the fifth inductor 330e may be connected in parallel to ground 350. The sixth electrode 310f is connected to a sixth variable capacitor 320f and a sixth inductor 330f. The sixth variable capacitor 320f and the sixth inductor 330f may be connected in parallel to ground 350. In some implementations, the electrodes 310 are built horizontally across a single PC board, or may be built vertically with each electrode 310 being contained on a different layer of the PC board. This may assist in manufacturing by allowing the small gaps required between the electrodes 310 to be more easily created.

In one example, with six electrodes 310, 310a . . . f for a phase shifter 300 tuned to operate at 2.6 gHz and each variable capacitor 320 has a capacitance of 0.5 pF, the resolution of the phase shifter 300 will be approximately one degree. If each variable capacitor 320 has a capacitance of 2.5 pF, the resolution of the phase shifter 300 will be approximately three to four degrees. The insertion loss of a six electrode phase shifter will still approximately remain less than 0.5 degrees.

Figure 4:
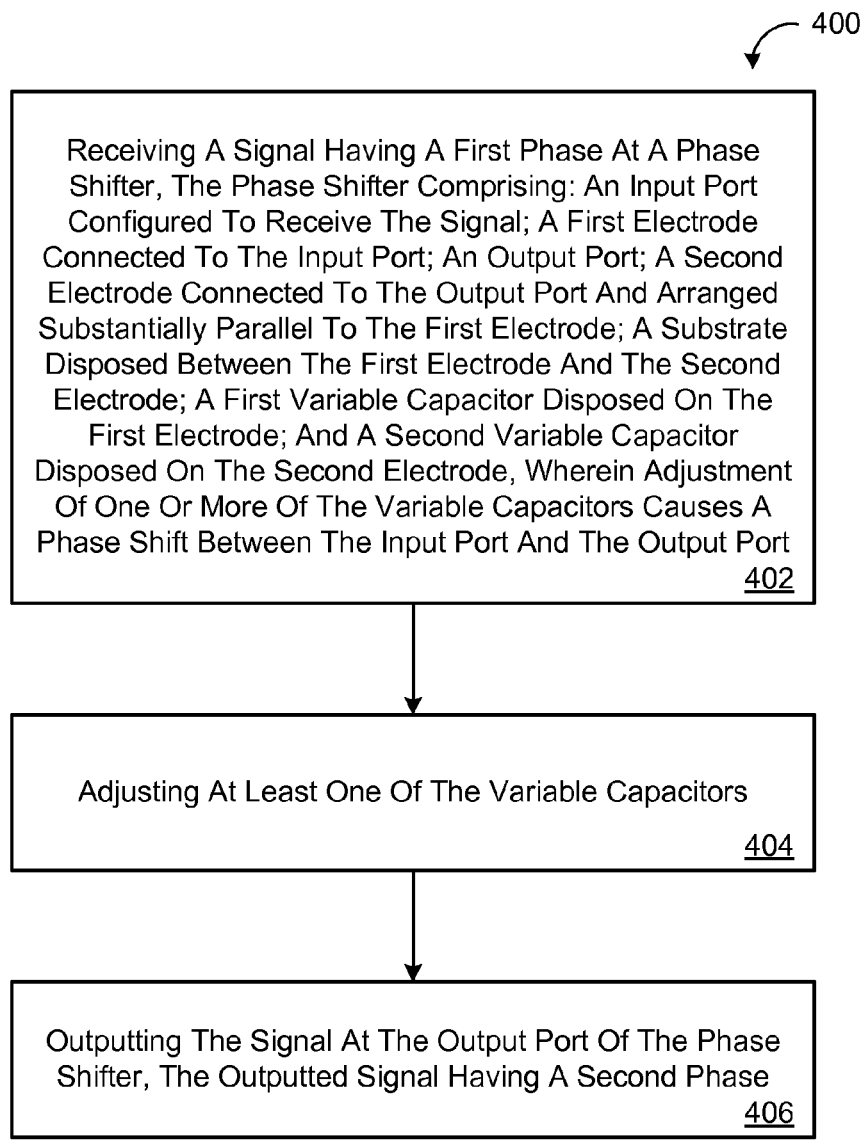
FIG. 4 shows a method for operating an interdigital capacitor low loss and high resolution phase shifter.

FIG. 4 shows a method 400 for operating an interdigital capacitor low loss and high resolution phase shifter 300. At block 402, the method 400 includes receiving a signal 106 having a first phase at a phase shifter 300. The phase shifter 300 includes an input port 312 configured to receive the signal 106, a first electrode 310a connected to the input port 312, an output port 314, and a second electrode 310b connected to the output port 314 and arranged substantially parallel to the first electrode 310a. The phase shifter 300 further includes a substrate 340 disposed between the first electrode 310a and the second electrode 310b, a first variable capacitor 320a disposed on the first electrode 310a, and a second variable capacitor 320b disposed on the second electrode 310b, wherein adjustment of one or more of the variable capacitors 320 causes a phase 124 shift between the input port 312 and the output port 314. At block 404, the method 400 includes adjusting at least one of the variable capacitors 320. At least one of the variable capacitors 320 may be adjusted by a digital control. The variable capacitors 320 may be adjusted in response to the signal 106 at the input port 312 or the output port 314. In some examples, the variable capacitors 320 are adjusted in response to a desired beam shape from a phased array antenna 100. At block 406, the method 400 includes outputting the signal 106 at the output port 314 of the phase shifter 300, the outputted signal 106 having a second phase 124. The phase shifter 300 completes in phase 124 shift in response to the settings of the variable capacitor 320 allowing a phase 124 adjusted signal 106 to exit the output port 314.

In some examples, the phase shifter 300 further includes a first inductor 330a disposed on the first electrode 310a in parallel with the first variable capacitor 320a, and a second inductor 330b disposed on the second electrode 310b in parallel with the second variable capacitor 320b. Each variable capacitor 320 may be shunt with the corresponding inductor 330 on the respective electrode 310. At least one variable capacitor 320 may be a digitally adjustable variable capacitor 320. The method 400 may include independently adjusting the variable capacitors 320.

The phase shifter 300 may further include a third electrode 310c connected to the first electrode 310a and arranged substantially parallel to the first electrode 310a and the second electrode 310b, a fourth electrode 310d connected to the second electrode 310b and arranged substantially parallel to the first electrode 310a, the second electrode 310b, and the third electrode 310c, a third variable capacitor 320c disposed on the third electrode 310c, and a fourth variable capacitor 320d disposed on the fourth electrode 310d. The phase shifter 300 may further include a third inductor 330c disposed on the third electrode 310c in parallel with the third variable capacitor 320c, and a fourth inductor 330d disposed on the fourth electrode 310d in parallel with the fourth variable capacitor 320d, wherein each variable capacitor 320 is shunt with the corresponding inductor 330 on the respective electrode 310. The method 400 may further include outputting the signal 106 from the output port 314 of the phase shifter 300 to an antenna 122.

A number of implementations have been described. Nevertheless, it will be understood that various modifications may be made without departing from the spirit and scope of the disclosure. Accordingly, other implementations are within the scope of the following claims.

What is claimed is:
1. A phase shifter comprising:
   an input port;
   a first electrode connected to the input port;
   an output port;
   a second electrode connected to the output port and arranged substantially parallel to the first electrode;
   a third electrode connected to the first electrode and arranged substantially parallel to the first electrode and the second electrode;

a fourth electrode connected to the second electrode and arranged substantially parallel to the first electrode, the second electrode, and the third electrode;
a substrate disposed between the first electrode and the second electrode;
a first variable capacitor disposed on the first electrode;
a second variable capacitor disposed on the second electrode;
a third variable capacitor disposed on the third electrode; and
a fourth variable capacitor disposed on the fourth electrode,
wherein adjustment of one or more of the variable capacitors causes a phase shift between the input port and the output port.

2. The phase shifter of claim 1, further comprising:
a first inductor disposed on the first electrode in parallel with the first variable capacitor; and
a second inductor disposed on the second electrode in parallel with the second variable capacitor.

3. The phase shifter of claim 2, wherein each variable capacitor is shunt with the corresponding inductor on the respective electrode.

4. The phase shifter of claim 1, wherein at least one variable capacitor is a digitally adjustable variable capacitor.

5. The phase shifter of claim 1, wherein each variable capacitor is independently adjustable in response to a change in a signal entering the input port.

6. The phase shifter of claim 1, further comprising:
a third inductor disposed on the third electrode in parallel with the third variable capacitor; and
a fourth inductor disposed on the fourth electrode in parallel with the fourth variable capacitor,
wherein each variable capacitor is shunt with the corresponding inductor on the respective electrode.

7. A system comprising:
an antenna configured to emit a signal; and
a phase shifter connected to the antenna, the phase shifter comprising:
an input port configured to receive the signal;
a first electrode connected to the input port;
an output port in communication with the antenna;
a second electrode connected to the output port and arranged substantially parallel to the first electrode;
a third electrode connected to the first electrode and arranged substantially parallel to the first electrode and the second electrode;
a fourth electrode connected to the second electrode and arranged substantially parallel to the first electrode, the second electrode, and the third electrode;
a substrate disposed between the first electrode and the second electrode;
a first variable capacitor disposed on the first electrode;
a second variable capacitor disposed on the second electrode;
a third variable capacitor disposed on the third electrode; and
a fourth variable capacitor disposed on the fourth electrode,
wherein adjustment of one or more of the variable capacitors causes a phase shift between the input port and the output port.

8. The system of claim 7, further comprising a transceiver connected to the antenna and configured to transmit or receive the signal, wherein the transceiver comprising the phase shifter.

9. The system of claim 7, wherein the phase shifter further comprises:
a first inductor disposed on the first electrode in parallel with the first variable capacitor; and
a second inductor disposed on the second electrode in parallel with the second variable capacitor.

10. The system of claim 9, wherein each variable capacitor is shunt with the corresponding inductor on the respective electrode.

11. The system of claim 7, wherein at least one variable capacitor is a digitally adjustable variable capacitor.

12. The system of claim 7, wherein each variable capacitor is independently adjustable in response to a change in the signal entering the input port.

13. The system of claim 7, wherein the phase shifter further comprises:
a third inductor disposed on the third electrode in parallel with the third variable capacitor; and
a fourth inductor disposed on the fourth electrode in parallel with the fourth variable capacitor,
wherein each variable capacitor is shunt with the corresponding inductor on the respective electrode.

14. The system of claim 7, wherein the adjustment of one or more of the variable capacitors causes the phase shift to be approximately between zero and 360 degrees between the input port and the output port.

15. A method comprising:
receiving a signal having a first phase at a phase shifter, the phase shifter comprising:
an input port configured to receive the signal;
a first electrode connected to the input port;
an output port;
a second electrode connected to the output port and arranged substantially parallel to the first electrode;
a third electrode connected to the first electrode and arranged substantially parallel to the first electrode and the second electrode;
a fourth electrode connected to the second electrode and arranged substantially parallel to the first electrode, the second electrode, and the third electrode;
a substrate disposed between the first electrode and the second electrode;
a first variable capacitor disposed on the first electrode;
a second variable capacitor disposed on the second electrode;
a third variable capacitor disposed on the third electrode; and
a fourth variable capacitor disposed on the fourth electrode,
wherein adjustment of one or more of the variable capacitors causes a phase shift between the input port and the output port;
adjusting at least one of the variable capacitors; and
outputting the signal at the output port of the phase shifter, the outputted signal having a second phase.

16. The method of claim 15, wherein the phase shifter further comprises:
a first inductor disposed on the first electrode in parallel with the first variable capacitor; and
a second inductor disposed on the second electrode in parallel with the second variable capacitor.

17. The method of claim 16, wherein each variable capacitor is shunt with the corresponding inductor on the respective electrode.

18. The method of claim 15, wherein at least one variable capacitor is a digitally adjustable variable capacitor.

19. The method of claim 15, further comprising independently adjusting the variable capacitors.

20. The method of claim 15, wherein the phase shifter further comprises:
   a third inductor disposed on the third electrode in parallel with the third variable capacitor; and
   a fourth inductor disposed on the fourth electrode in parallel with the fourth variable capacitor,
   wherein each variable capacitor is shunt with the corresponding inductor on the respective electrode.

21. The method of claim 15, wherein the first variable capacitor, the second variable capacitor, the third variable capacitor, and the forth variable capacitor are configured to provide a high resolution phase change.

22. The method of claim 15, further comprising outputting the signal from the output port of the phase shifter to an antenna.

* * * * *